United States Patent
Ichiraku

(10) Patent No.: US 10,995,403 B2
(45) Date of Patent: May 4, 2021

(54) METHOD OF FORMING ALUMINUM NITRIDE FILM AND METHOD OF MANUFACTURING SEMICONDUCTOR LIGHT-EMITTING ELEMENT

(71) Applicant: NICHIA CORPORATION, Anan (JP)

(72) Inventor: Yojiro Ichiraku, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/452,454

(22) Filed: Jun. 25, 2019

(65) Prior Publication Data

US 2019/0390330 A1    Dec. 26, 2019

(30) Foreign Application Priority Data

Jun. 26, 2018   (JP) .............................. JP2018-121103

(51) Int. Cl.
   *C23C 16/30*       (2006.01)
   *H01L 33/54*       (2010.01)
   (Continued)

(52) U.S. Cl.
   CPC ........ *C23C 16/303* (2013.01); *C23C 16/0254* (2013.01); *C30B 25/186* (2013.01);
   (Continued)

(58) Field of Classification Search
   CPC ........... H01L 21/02694; H01L 21/0243; H01L 21/02458; H01L 21/2502; H01L 21/02656;
   (Continued)

(56) References Cited

U.S. PATENT DOCUMENTS 6,153,010 A  * 11/2000  Kiyoku ................. H01L 33/007
                                                        117/95
6,503,610 B2 *  1/2003  Hiramatsu ............. C30B 23/02
                                                        117/104
(Continued)

FOREIGN PATENT DOCUMENTS

JP        2004-111766        4/2004
JP        2006-332570 A     12/2006
(Continued)

OTHER PUBLICATIONS

H. Fukuyama et al., Nitridation behavior of sapphire using a carbon-saturated N2—CO gas mixture, Feb. 16, 2010, J. Applied Physics, vol. 107, No. 043502, pp. 043502-1 to 043502-7. (Year: 2010).*

(Continued)

*Primary Examiner* — Victoria K. Hall
(74) *Attorney, Agent, or Firm* — Foley & Lardner LLP

(57) ABSTRACT

A method of forming an aluminum nitride film includes: preparing a substrate that comprises, in a surface thereof, a plurality of concave portions that are separated from each other; forming an aluminum nitride film on said surface of the substrate and on an inner surface of each of the concave portions such that open holes are formed in a portion of the aluminum nitride film corresponding to each of the concave portions, each of the holes being smaller than each of openings of the concave portions; and applying heat treatment to the substrate with the aluminum nitride film formed thereon in a nitrogen gas containing a carbon monoxide gas to close the holes formed in the aluminum nitride film.

15 Claims, 9 Drawing Sheets

(51) Int. Cl.
*H01L 33/56* (2010.01)
*H01L 21/02* (2006.01)
*H01L 33/20* (2010.01)
*C23C 16/02* (2006.01)
*C30B 33/02* (2006.01)
*C30B 29/40* (2006.01)
*C30B 25/18* (2006.01)
*H01L 21/324* (2006.01)
*C30B 29/68* (2006.01)
*C30B 25/02* (2006.01)

(52) U.S. Cl.
CPC ............ *C30B 29/403* (2013.01); *C30B 33/02* (2013.01); *H01L 21/0243* (2013.01); *H01L 21/0262* (2013.01); *H01L 21/02458* (2013.01); *H01L 21/02502* (2013.01); *H01L 21/02656* (2013.01); *H01L 21/02658* (2013.01); *H01L 21/02664* (2013.01); *H01L 21/02694* (2013.01); *H01L 21/3245* (2013.01); *H01L 33/20* (2013.01); *H01L 33/54* (2013.01); *H01L 33/56* (2013.01); *C23C 16/02* (2013.01); *C30B 25/02* (2013.01); *C30B 29/68* (2013.01); *H01L 21/0251* (2013.01); *H01L 21/0254* (2013.01); *H01L 21/02389* (2013.01); *H01L 21/02403* (2013.01); *H01L 21/02576* (2013.01); *H01L 21/02579* (2013.01); *H01L 2933/005* (2013.01); *H01L 2933/0025* (2013.01); *H01L 2933/0033* (2013.01)

(58) Field of Classification Search
CPC ......... H01L 21/02658; H01L 21/02664; H01L 33/20; H01L 21/3245; C30B 25/186; C30B 33/02; C30B 29/403
See application file for complete search history.

(56) References Cited

U.S. PATENT DOCUMENTS

| | | | | |
|---|---|---|---|---|
| 7,141,444 B2* | 11/2006 | Koike | ................ | H01L 21/0237 438/34 |
| 7,687,824 B2 | 3/2010 | Shibata et al. | | |
| 9,000,415 B2* | 4/2015 | Park | ................... | H01L 33/025 257/13 |
| 9,048,347 B2* | 6/2015 | Wei | ................... | H01L 21/02642 |
| 9,318,326 B2* | 4/2016 | Von Kanel | ........ | H01L 21/02639 |
| 9,614,124 B2* | 4/2017 | Fukuyama | .............. | H01L 33/12 |
| 9,691,939 B2* | 6/2017 | Jain | ................... | H01L 29/7786 |
| 10,622,515 B2* | 4/2020 | Jain | ......................... | H01L 33/12 |
| 2003/0203531 A1* | 10/2003 | Shchukin | ............... | B82Y 10/00 438/77 |
| 2005/0287774 A1 | 12/2005 | Shibata et al. | | |
| 2009/0166650 A1* | 7/2009 | Huang | ................... | H01L 33/007 257/94 |
| 2010/0032647 A1* | 2/2010 | Khan | ........................ | H01L 33/32 257/13 |
| 2010/0065854 A1* | 3/2010 | Kamber | .............. | H01L 21/0237 257/76 |
| 2010/0099213 A1* | 4/2010 | Wu | ....................... | H01L 33/007 438/46 |
| 2011/0163295 A1* | 7/2011 | Wu | ................... | H01L 21/02642 257/13 |
| 2012/0258286 A1* | 10/2012 | Amano | ................. | C30B 29/406 428/162 |
| 2013/0056770 A1* | 3/2013 | Shatalov | ............. | H01L 21/0254 257/94 |
| 2014/0134773 A1* | 5/2014 | Jain | ......................... | H01L 33/12 438/44 |
| 2015/0340558 A1* | 11/2015 | Lee | ........................ | H01L 33/06 257/13 |
| 2015/0372190 A1* | 12/2015 | Hirayama | ......... | H01L 21/02639 257/99 |
| 2016/0190387 A1* | 6/2016 | Sun | ...................... | H01L 21/0254 438/47 |
| 2016/0254411 A1* | 9/2016 | Fukuyama | .......... | H01L 33/0095 257/76 |
| 2016/0265138 A1* | 9/2016 | Pernot | ................... | H01L 33/145 |
| 2017/0069785 A1* | 3/2017 | Tak | .................... | H01L 21/30604 |
| 2017/0092482 A1* | 3/2017 | De Mierry | ............. | C30B 29/66 |
| 2017/0229612 A1* | 8/2017 | Shatalov | ........... | H01L 21/02458 |
| 2018/0108806 A1* | 4/2018 | Jain | .................. | H01L 21/02458 |
| 2018/0158681 A1* | 6/2018 | Fujikura | ............. | H01L 21/0242 |
| 2019/0040546 A1* | 2/2019 | Noguchi | ............. | H01L 21/0254 |
| 2019/0067512 A1* | 2/2019 | Okuno | ............. | H01L 21/02661 |
| 2020/0366050 A1* | 11/2020 | McLaurin | ........... | H01S 5/34333 |
| 2020/0366064 A1* | 11/2020 | McLaurin | ......... | H01L 21/02647 |

FOREIGN PATENT DOCUMENTS

| | | | |
|---|---|---|---|
| JP | 2008-060519 A | 3/2008 | |
| JP | 2008-115023 A | 5/2008 | |
| JP | 2009-242130 A | 10/2009 | |
| JP | 2015-042598 A | 3/2015 | |
| JP | 2018-093113 A | 6/2018 | |
| WO | WO-2017/134708 A1 * | 8/2017 | ............ C30B 29/38 |

OTHER PUBLICATIONS

W. Nakao & H. Fukuyama, Gibbs Energy Change of Carbothermal Nitridation Reaction of γ-AlON and Its Thermodynamic Stability, 2005, J. Am. Ceram. Soc., vol. 88, No. 11, pp. 3170-3176. (Year: 2005).*

W. Nakao et al., Gibbs Energy Change of Carbothermal Nitridation of Al2O3 to Form AlN and Reassessment of Thermochemical Properties of AlN, 2002, J. Am. Ceram. Soc., vol. 85, No. 4, pp. 889-896. (Year: 2002).*

Fukuyama et al., Single crystalline aluminum nitride films fabricated by nitriding α-Al2O3, Jul. 20, 2006, J. Applied Physics, vol. 100, No. 024905, pp. 024905-1 to 024905-7. (Year: 2006).*

W. Nakao et al., Thermodynamic Stability of γ-Aluminum Oxynitride, Jan. 13, 2003, J. Electrochem. Soc., vol. 150, No. 2, pp. J1-J7. (Year: 2003).*

K. Fujita et al., HVPE growth of thick AlN on trench-patterned substrate, Mar. 23, 2011, Physica Status Solidi C, vol. 8, No. 5, pp. 1483-1486. (Year: 2011).*

Y. Katagiri et al., Low-pressure HVPE growth of crack-free thick AlN on a trench-patterned AlN template, Jan. 14, 2009, J. Crystal Growth, vol. 311, pp. 2831-2833. (Year: 2009).*

Machine translation, Noguchi, WO 2017/134708, translation date: Jul. 31, 2020, Espacenet, all pages (Year: 2020).*

H. Miyake et al., Annealing of an AlN buffer layer in N2—CO for growth of a high quality AlN film on sapphire, Jan. 6, 2016, Applied Physics Express, vol. 9, No. 025501, pp. 1-4. (Year: 2016).*

* cited by examiner

METHOD OF FORMING ALUMINUM NITRIDE FILM AND METHOD OF MANUFACTURING SEMICONDUCTOR LIGHT-EMITTING ELEMENT

CROSS-REFERENCE TO RELATED APPLICATION

This application claims priority to Japanese Patent Application No. 2018-121103, filed on Jun. 26, 2018, the disclosure of which is hereby incorporated by reference in its entirety.

BACKGROUND

Technical Field

The present invention relates to a method of forming an aluminum nitride film and a method of manufacturing a semiconductor light-emitting element.

Description of the Related Art

In recent years, nitride semiconductor light-emitting elements, such as light-emitting diodes (LEDs) formed using nitride semiconductors, have been widely used. A nitride semiconductor light-emitting element is fabricated, for example, by growing a plurality of nitride semiconductor layers, which include a light-emitting layer on an aluminum nitride (AlN) film formed on top of a sapphire substrate. The AlN film provided on the sapphire substrate is required to have adequate crystallinity and high surface flatness in order to grow nitride semiconductors with few threading dislocations. To meet such a requirement, JP 2015-42598 A discloses that an AlN film is formed on a sapphire substrate or the like and then subjected to heat treatment at a high temperature of 1,500° C. or higher in a mixed gas of nitrogen and carbon monoxide ($N_2$ and CO). As described in JP 2015-42598 A, applying the heat treatment at a high temperature of 1,500° C. or higher under the mixed gas of $N_2$ and CO can drastically improve the crystallinity of the AlN film formed on the flat surface of the sapphire substrate while improving the surface flatness of the AlN film. By stacking an AlGaN-based nitride semiconductor layer on the AlN film formed in this way, a semiconductor light-emitting element that emits ultraviolet light can be formed.

SUMMARY

However, the semiconductor light-emitting element that emits the ultraviolet light does not produce sufficient light output and thus is still required to improve its light output. The ultraviolet semiconductor light-emitting element has a higher optical absorptance within its semiconductors than a visible light semiconductor light-emitting element. Thus, by reducing multiple reflections within the semiconductors, the ultraviolet semiconductor light-emitting element can improve its light extraction efficiency, thereby improving the light output therefrom. There is a method for reducing multiple reflections within the semiconductors, which involves applying concavo-convex processing to the surface of a substrate to thereby reduce the probability of reflections on the interface between the substrate and a semiconductor. Therefore, to improve the light output from the nitride semiconductor light-emitting element, one more method is needed to form an AlN film with a flat surface, on the substrate subjected to the concavo-convex processing.

Accordingly, it is an object of the present invention to provide a method of forming an aluminum nitride (AlN) film with a flat surface, on a substrate subjected to concavo-convex processing.

According to one embodiment, a method of forming an aluminum nitride film includes: preparing a substrate that has a plurality of separate concave portions on a surface thereof; forming an aluminum nitride film on the surface of the substrate including an inner surface of each of the concave portions such that open holes are formed in a portion of the aluminum nitride film corresponding to each of the concave portions, each of the holes being smaller than each of openings of the concave portions; and applying heat treatment to the substrate with the aluminum nitride film formed thereon in a nitrogen gas containing a carbon monoxide gas to close the holes formed in the aluminum nitride film.

According to certain embodiments of the methods of forming an aluminum nitride film of the embodiment of the present disclosure, an aluminum nitride (AlN) film that has a flat surface can be formed on a substrate subjected to the concavo-convex processing.

DETAILED DESCRIPTION

The inventors of the present application have intensively studied for the purpose of the formation of an aluminum nitride (AlN) film with a flat surface on a substrate subjected to concavo-convex processing.

In general, a gallium nitride-based semiconductor, such as GaN, can form a film with a flat surface even when grown on the substrate subjected to concavo-convex processing, as long as the film is grown to a certain thickness or more under growth conditions that induce lateral growth of a semiconductor.

The inventors of the present application have attempted to obtain an aluminum nitride film with a flat surface by thickly forming the aluminum nitride film on a substrate subjected to the concavo-convex processing. However, the lateral growth rate of aluminum nitride is lower than the longitudinal growth rate thereof, when compared to the above-described gallium nitride-based semiconductor, such as GaN. Because of this, an aluminum nitride film cannot have a flat surface while closing a hole inside an opening of the aluminum nitride film unless the aluminum nitride film is grown more thickly than a film of the gallium nitride-based semiconductor. Nevertheless, the formation of such a thick aluminum nitride film on the substrate leads to a problem of warpage of the substrate.

The increasing warpage of the substrate increases variations in the in-plane composition of a semiconductor multilayer structure, which has been formed by growing a nitride semiconductor. In particular, the increased variations in the in-plane composition of a light-emitting layer included in the semiconductor multilayer structure would widen the in-plane distribution of the emission wavelengths. In addition, there is another problem with the substrate in a wafer state, because this substrate becomes difficult to handle by adsorption with a chuck in a step following a process of growing the nitride semiconductor, for example, when forming an electrode or the like. As a result of further studies conducted by the inventors of the present application, it has been found that even in a state in which an opening in an aluminum nitride film is formed above a concave portion of a substrate, by annealing under specific conditions, the opening above the concave portion can be closed with the aluminum nitride film by itself to make its surface flat.

The present invention has been developed based on the findings described above.

A method of forming an aluminum nitride film according to an embodiment of the present invention will be described below with reference to the accompanying drawings.

Figure 1:
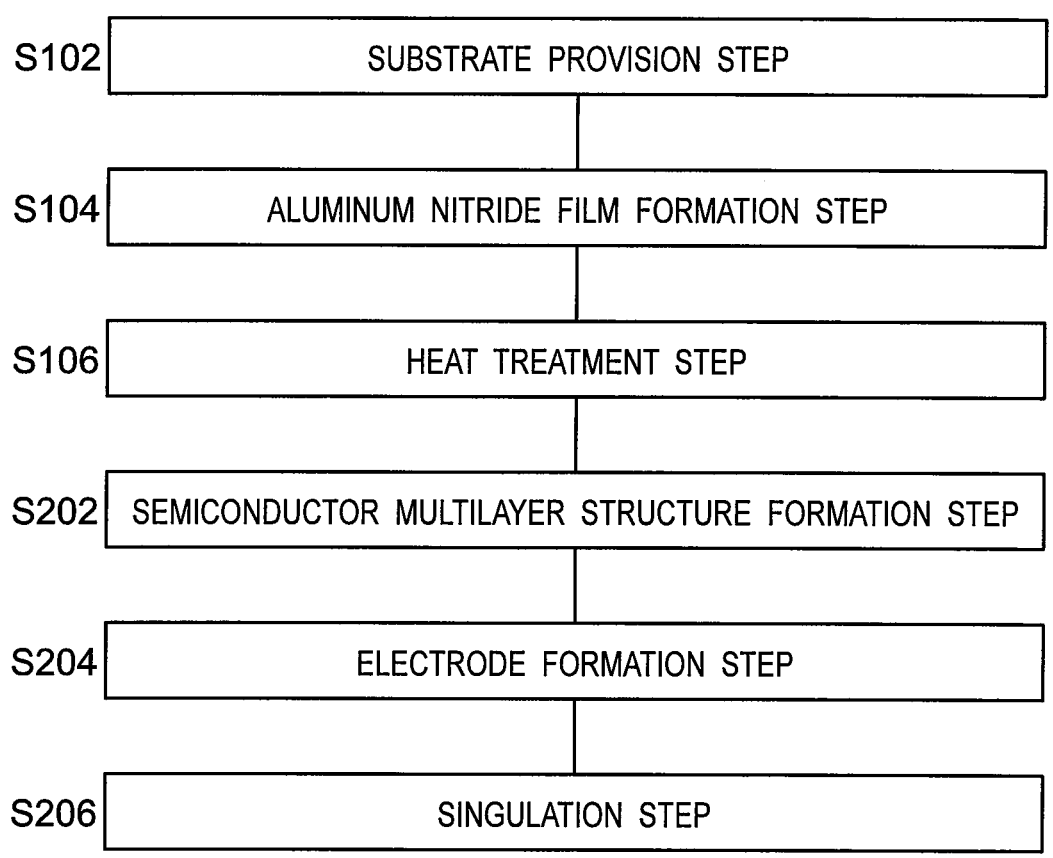
FIG. 1 is a flowchart showing a method of forming an aluminum nitride film and a method of manufacturing a semiconductor light-emitting element according to an embodiment of the present invention.

As shown in FIG. 1, the method of forming an aluminum nitride film according to the present embodiment is a method of forming an aluminum nitride film with a flat surface on a substrate having a plurality of separate concave portions on its surface. The method includes a substrate provision step S102, an aluminum nitride film formation step S104, and a heat treatment step S106. Each step will be described in detail below. The term "upper" as used herein indicates the direction in which the concave portions of the substrate open. That is, the term "upper" refers to an upward direction shown in FIG. 3.

(Substrate Provision Step S102)

In the substrate provision step S102, a substrate that has a plurality of separate concave portions on its upper surface is prepared.

Figure 2:
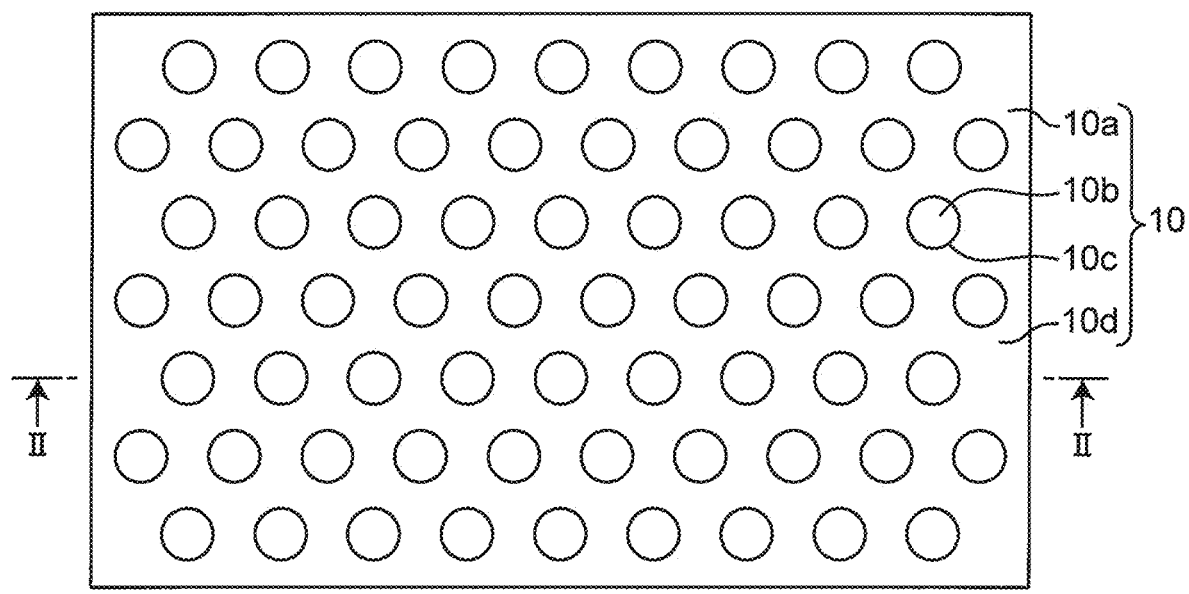
FIG. 2 is a schematic plan view of a substrate to be prepared in the method of forming an aluminum nitride film according to the embodiment of the present invention.
Figure 3:
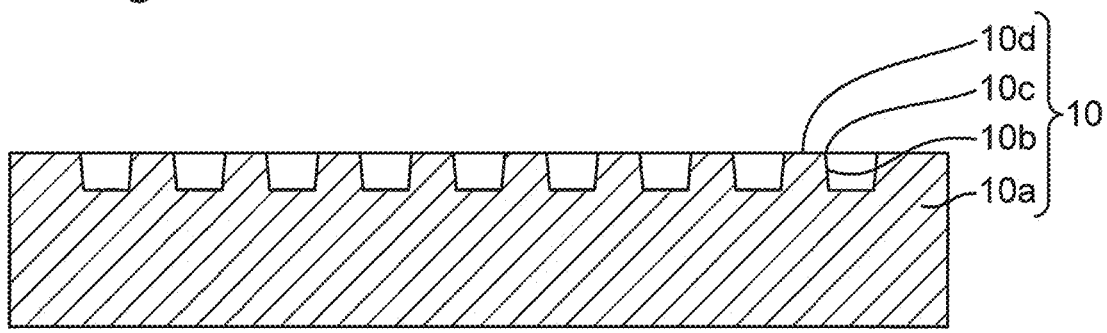
FIG. 3 is a schematic cross-sectional view taken along the line II-II of FIG. 2.

For example, as shown in FIG. 2, a substrate 10 is prepared, which is provided with concave portions 10b arranged at lattice points of a triangular lattice, each concave portion 10b having a circular opening 10c. Examples of material suitable for the substrate 10 include sapphire ($Al_2O_3$), AlN, AlGaN, and the like. As shown in FIGS. 2 and 3, the concave portion 10b is a truncated cone-shaped recess that has the circular opening 10c and the circular bottom surface that is smaller than the opening 10c. The concave portions 10b can be formed, for example, by photolithography or etching. An etching method is selected from either dry etching or wet etching depending on the shape of the concave portion. For example, in the case of forming the circular opening 10c, dry etching is suitable. A resist pattern may be formed by a nanoimprint method, instead of photolithography. In FIG. 3, reference numeral 10a denotes a base portion.

The concave portion 10b is not limited to the truncated cone shape. The concave portion 10b may be a cylindrical or conical recess that includes a bottom surface having substantially the same circular shape as the opening 10c. Alternatively, the concave portion 10b may be a polygonal recess that includes the opening 10c having a polygonal shape, such as a triangular shape, a square shape, or a hexagonal shape. In addition, the concave portion 10b may be a stripe-shaped recess in which the opening 10c is shaped to have its length in the long-axis direction longer than its width in the short-axis direction.

In the present embodiment, however, the opening 10c of the concave portion 10b is preferably circular. The occurrence of crystal defects can be suppressed by making the opening 10c of the concave portion 10b circular. That is, assuming that the aluminum nitride grows from an edge of the opening 10c to close the opening 10c, for example, if the opening 10c has a shape with any straight side(s), such as a square, the aluminum nitride grows perpendicularly to the side of the shape of the opening 10c in the top view. When the growth of the aluminum nitride progresses, a part of the aluminum nitride growing from one side would collide with another part of the aluminum nitride growing from another side, and consequently, the colliding parts would cause crystal defects. In contrast, when the shape of the opening 10c is circular, the aluminum nitride gradually grows from the edge of the opening 10c toward the center of the opening 10c. Thus, by making the shape of the opening 10c circular, the probability of occurrence of crystal defects can be reduced, compared to the opening having the shape with any straight line. The circular opening 10c can be obtained by dry etching using a circular mask. In a case in which the opening 10c of the concave portion 10b is circular, the diameter of the opening 10c is, for example, 30 nm or more and 15 µm or less, preferably 0.6 µm or more and 4 µm or less, and more preferably 3 µm or less. By setting the opening 10c to such a size, a hole is easily formed in the aluminum nitride film as described later, and then the hole is easily closed therewith by the heat treatment. To reduce the probability of reflections occurring at the interface between the substrate and the semiconductor by providing the concave portions 10b, the diameter of the opening 10c is more preferably 0.7 to 1.5 µm. The cross-sectional shape of the concave portion 10b may be a shape with a right angle or a tapered shape.

The concave portion 10b does not necessarily have a shape that can clearly define the boundary between its inner peripheral surface and its bottom surface by discontinuously changing the surface directions of the inner peripheral surface and the bottom surface. For example, the entire inner surface of the concave portion 10b may be formed by a curved surface.

The depth of the concave portion 10b is preferably, for example, 50 nm or more and 10 µm or less, and more preferably 3 µm or less. By setting the concave portion 10b to such a size, a hole is easily formed in the aluminum nitride film as described later, and then the hole is easily closed therewith by the heat treatment. To reduce the probability of reflections occurring at the interface between the substrate and the semiconductor by providing the concave portions 10b, the depth of the concave portion 10b is preferably 0.4 to 1.0 µm.

(Aluminum Nitride Film Formation Step S104)

In the aluminum nitride film formation step S104, aluminum nitride is grown on the upper surface of the substrate 10, for example, by a vapor deposition method, such as a metal organic chemical vapor deposition method or a hydride vapor deposition method, or a reactive sputtering method, to form an aluminum nitride film 1. As used herein, the term "upper surface of the substrate 10" includes an inner surface of the concave portion 10b, and the term "flat surface 10d" refers to a part of the upper surface of the substrate that excludes the inner surfaces of the concave portions 10b. When sapphire is used as the material of the substrate 10, a flat surface 10d is preferably a C-plane of sapphire on which aluminum nitride can grow with good crystallinity. The bottom surface of the concave portion 10b may also be a C-plane of sapphire. A buffer layer made of, for example, AlN may be first formed on the upper surface of the substrate 10, and then an aluminum nitride film may be formed on the buffer layer. In a case in which an aluminum nitride film is formed by the reactive sputtering method, a buffer layer may be unnecessary.

In the case in which aluminum nitride is grown by the reactive sputtering method, for example, a target made of aluminum (Al) is opposed to the upper surface of the substrate 10 in a vacuum chamber, and then gas containing a nitrogen element is introduced into the vacuum chamber, whereby plasma is generated to grow the aluminum nitride on the upper surface of the substrate 10. In a case in which aluminum nitride is grown by the metal organic chemical vapor deposition method, for example, trimethylaluminum (TMA) and ammonia ($NH_3$) is used as a source gas, and hydrogen is used as a carrier gas. The aluminum nitride is grown by adjusting the flow rate ratio of trimethylaluminum (TMA) to ammonia ($NH_3$) as appropriate. Alternatively, the carrier gas in use may be a nitrogen gas or a mixed gas of hydrogen and nitrogen. The growth conditions of the aluminum nitride film preferably include conditions for the lateral growth thereof as well as the vertical growth thereof. Consequently, each opening 2a can be smaller than the opening 10c of the concave portion 10b and thus can be easily closed by the aluminum nitride film in the subsequent heat treatment step S106 described later. The conditions for promoting the lateral growth include, for example, raising the growth temperature, decreasing the V/III ratio, increasing the growth rate, and the like. As used herein, the term "vertical growth" refers to the growth in the direction perpendicular to the flat surface 10d of the substrate 10, and the term "lateral growth" refers to the growth in the direction parallel to the flat surface 10d.

Figure 4:
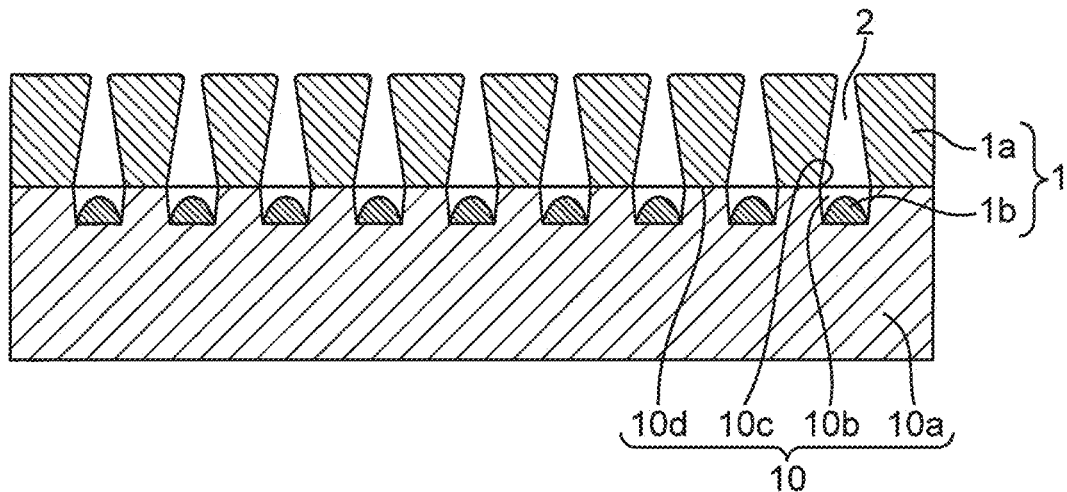
FIG. 4 is a schematic cross-sectional view taken when the aluminum nitride film is formed in the method of forming an aluminum nitride film of the embodiment.
Figure 6:
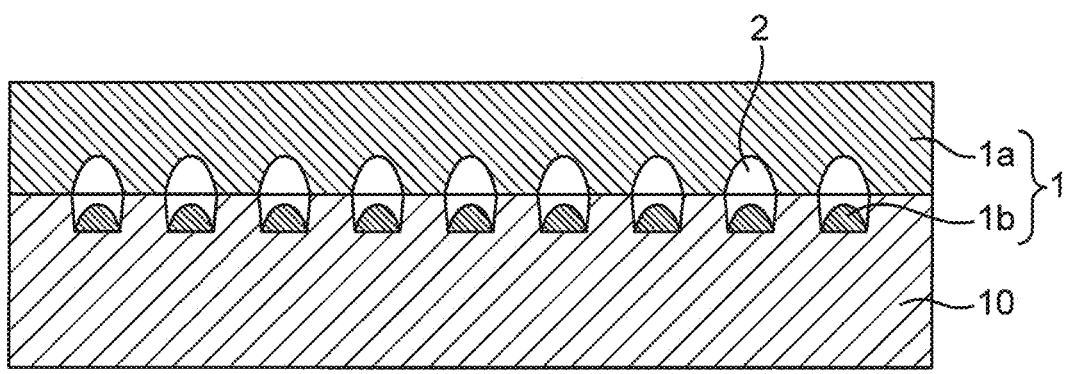
FIG. 6 is a schematic cross-sectional view of the aluminum nitride film subjected to heat treatment in the method of forming an aluminum nitride film of the embodiment.

In the aluminum nitride film formation step S104, aluminum nitride is grown on the substrate 10 by using either the reactive sputtering method or the vapor deposition method. Specifically, aluminum nitride is grown mainly from the flat surface 10d, which is the upper surface of the substrate 10. The aluminum nitride is also grown from the bottom surface of the concave portion 10b. At this time, even in either the reactive sputtering method or the vapor deposition method, the amount of source gas supplied to the inside of the concave portions 10b is less than the amount of source gas supplied to the flat surface 10d, so that the growth rate of the aluminum nitride at the bottom surface of the concave portion 10b is lower than the growth rate of the aluminum nitride at the flat surface 10d. Consequently, the formed aluminum nitride film includes a first portion 1a grown on the flat surface 10d and a second portion 1b grown on the bottom surface of the concave portion 10b. The thickness of the second portion 1b is smaller than the thickness of the first portion 1a. The aluminum nitride film is also grown in the lateral direction at a low growth rate, compared to in the vertical direction. Thus, the cross-sectional shape of the first portion 1a on its vertical cross section, including a central axis of the concave portion 10b, is an inverted trapezoidal shape in which the length of a lower base in contact with the flat surface 10d of the substrate is shorter than the length of an upper base. Consequently, as schematically shown in FIGS. 4 and 6, a cavity 2 is formed above each concave portion 10b, so that the cavity 2 opens on the upper surface of the aluminum nitride film 1 through the substantially circular opening 2a, which is smaller than the opening 10c of the concave portion 10b. In other words, the aluminum nitride film formation step S104 allows for the formation of the openings 2a on the upper surface of the aluminum nitride film (first portion 1a), and thus grows the aluminum nitride film (first portion 1a) to a thickness that does not substantially cause adverse affects, such as warpage of the substrate.

Specifically, for example, the aluminum nitride film 1 is preferably formed to have a thickness that is equal to or more than the depth of the concave portion 10b and 12 times or less the depth of the concave portion 10b. Regarding the relationship with the dimension of the opening 10c of the concave portion 10b, the aluminum nitride film 1 is preferably formed to have a thickness that is 0.5 times or more and 6 times or less the maximum width of the opening 10c of the concave portion 10b. The thickness of the aluminum nitride film 1 is preferably 3 or less, as the thickness of the aluminum nitride film at which the substrate 10 is hardly warped. The thickness of the aluminum nitride film 1 can be, for example, 1.5 µm or more.

As used herein, the term "depth of the concave portion 10b" refers to a depth of the deepest part of the concave portion 10b, and the term "thickness of the aluminum nitride film" refers to a distance from the flat surface 10d (part excluding the concave portion 10b) of the substrate 10 to the upper surface of the aluminum nitride film. When the upper surface of the aluminum nitride film is not flat, the term "thickness of the aluminum nitride film" refers to the longest distance from the flat surface 10d of the substrate 10 to the upper surface of the aluminum nitride film and is hereinafter referred to as a thickness t.

Figure 5:
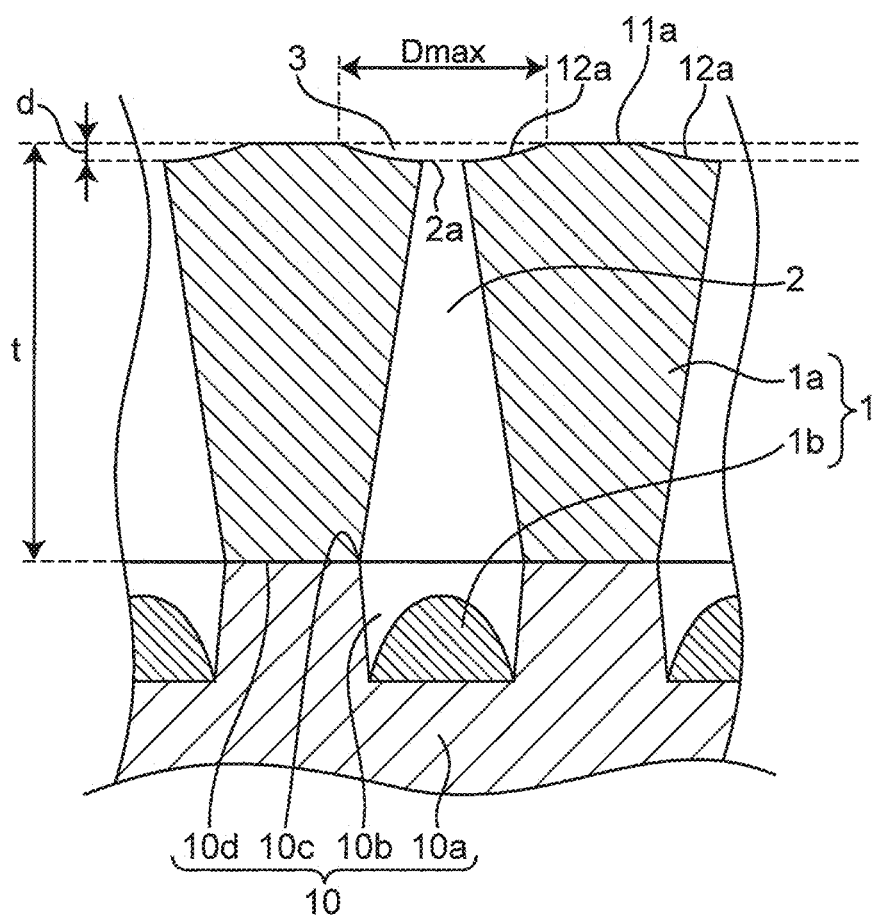
FIG. 5 is an enlarged cross-sectional view of a part shown in FIG. 4.

As shown in FIG. 5, a concave portion having a mortar shape (mortar-shaped concave portion 3) may be formed around the opening 2a on the upper surface of the aluminum nitride film so as to enclose the opening 2a. In this case, a portion of the upper surface of the aluminum nitride film, excluding an inclined surface 12a of the mortar-shaped concave portion 3, becomes substantially flat (hereinafter, this flat portion is referred to as a flat surface 11a). The flat surface 11a is substantially parallel to the flat surface 10d of the substrate 10. It is considered that the flat surface 10d is formed of a single crystal, and the mortar-shaped concave portion 3 is formed by crystals that have orientations that are irregular compared to the orientation of the crystal forming the flat surface 10d. According to the studies conducted by the present inventors, when the mortar-shaped concave portion is formed to enclose the corresponding opening 2a, it is confirmed that, as the inclination of the inclined surface 12a increases relative to the flat surface 11a, which is the upper surface of the aluminum nitride film, the opening 2a in the aluminum nitride film is less likely to be closed with the aluminum nitride film in the subsequent heat treatment step S106.

When the mortar-shaped concave portion is formed to enclose the opening 2a, the inclination of the inclined surface 12a, i.e., the ratio of the depth to the maximum diameter of the mortar-shaped concave portion 3 is preferably small. Specifically, the growth conditions of the aluminum nitride film are set such that the ratio (d/Dmax) of the depth d of the mortar-shaped concave portion 3 to the maximum diameter Dmax of the mortar-shaped concave portion 3 is 0.19 or less and preferably 0.1 or less. Here, the depth d is defined as a distance between a first reference plane that includes the flat surface 11a and a second reference plane that is parallel to the first reference plane and includes the opening 2a of the mortar-shaped concave portion. The second reference plane including the opening 2a is positioned in the depth direction such that its open area is the smallest in the opening located at the bottom of the mortar-shaped concave portion.

(Heat Treatment Step S106)

In the heat treatment step S106, the substrate 10 with the aluminum nitride film 1 formed thereon is subjected to heat treatment in a nitrogen gas containing a carbon monoxide gas, thereby closing the holes formed in the aluminum nitride film 1 to planarize the upper surface of the aluminum nitride film 1. Here, the temperature of the heat treatment and the flow rate ratio of the carbon monoxide gas during the heat treatment (i.e., the ratio of the flow rate of the carbon monoxide gas to the total flow rate of the carbon monoxide gas and the nitrogen gas) are optimized in consideration of the size and depth of the opening 10c of the concave portion 10b (the diameter of the opening 10c of the concave portion 10b), the film thickness of the aluminum nitride film 1, and the like.

In the method of forming the aluminum nitride film 1 of the present embodiment, the heat treatment temperature and the ratio of the flow rate of the carbon monoxide gas to the total flow rate of the carbon monoxide gas and the nitrogen gas in the heat treatment step S106 can be set as appropriate based on the following findings made by the present inventors.

First, as a result of the confirmation conducted by the present inventors regarding the flow rate ratio of the carbon monoxide gas, even when subjected to the heat treatment in the nitrogen gas alone, the aluminum nitride film 1 grown on the substrate 10 takes a long time to close the holes formed in the aluminum nitride film 1. Consequently, the holes are not easily closed by the aluminum nitride film itself.

In contrast, when subjected to the heat treatment in a nitrogen gas containing an appropriate amount of carbon monoxide gas, it is inferred that heat is more easily transferred through the aluminum nitride film 1. Consequently, the holes formed in the aluminum nitride film 1 are more likely to be closed by the aluminum nitride film itself.

Conversely, when the carbon monoxide gas concentration is extremely high, it is inferred that, for example, part of aluminum nitride (AlN) is oxidized to form aluminum oxynitride (AlON) that is difficult to move. In this case, the openings 2a are considered to be less likely to be closed by the aluminum nitride film, which inhibits the formation of the high-quality aluminum nitride film.

The heat treatment temperature also affects the easiness of movement of the material of the aluminum nitride as well as the formation of the aluminum oxynitride (AlON).

Therefore, in consideration of the above-described factors, the heat treatment conditions, including the atmosphere and the heat treatment temperature in the heat treatment, are set as appropriate. Specifically, the ratio of the flow rate of the carbon monoxide gas to the total flow rate of the carbon monoxide gas and the nitrogen gas is preferably in a range of 0.1 to 0.3. The heat treatment temperature in the heat treatment step S106 is preferably in a range of 1,750° C. or higher and 1,950° C. or lower.

The heat treatment time is set at, for example, 5 hours or more, and is also set at, for example, 168 hours or less, and preferably less than 15 hours.

Figure 7:
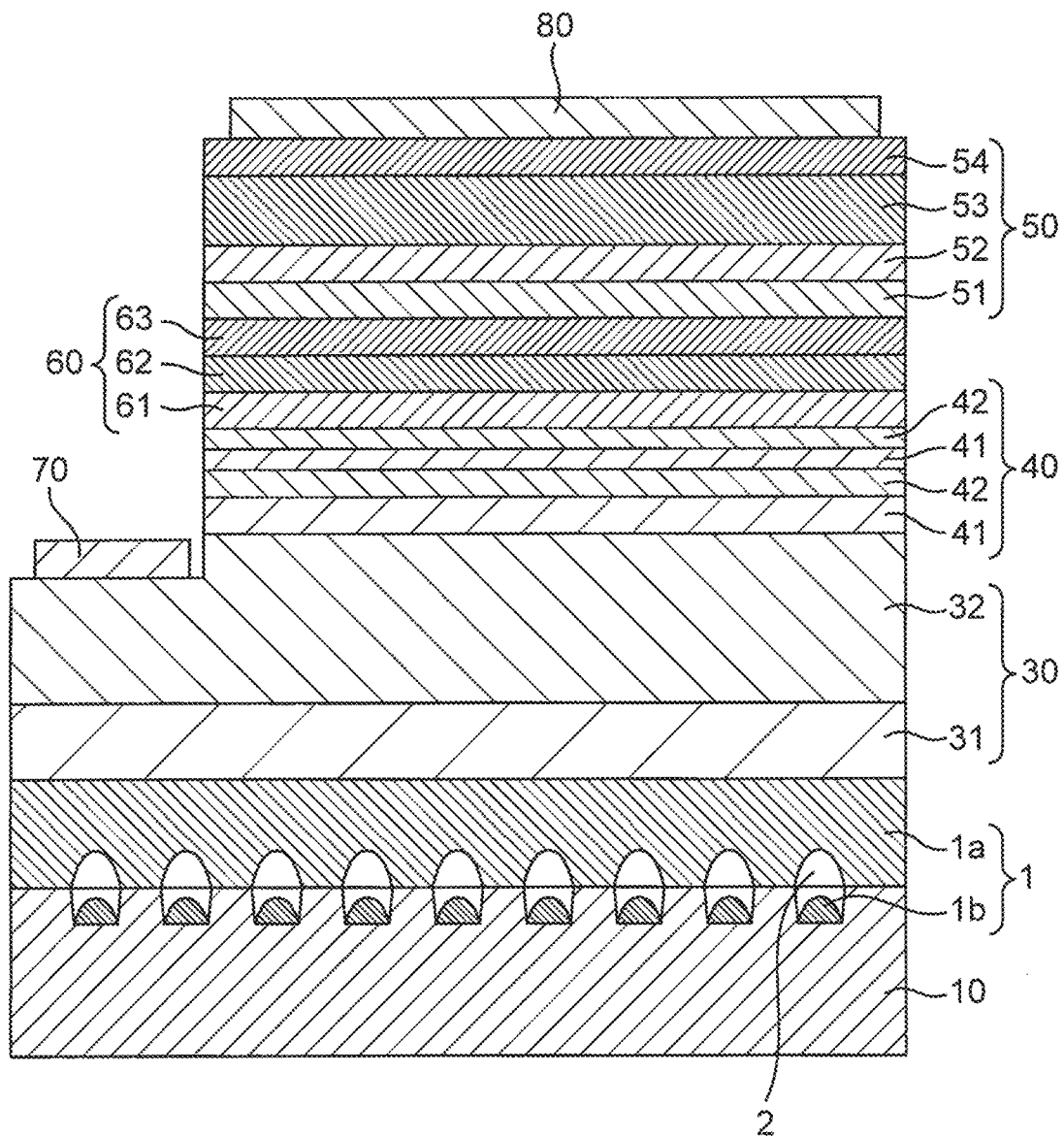
FIG. 7 is a schematic cross-sectional view showing the semiconductor light-emitting element of the embodiment.

According to the method of forming an aluminum nitride film of the embodiment configured as described above, the aluminum nitride film that has a flat surface with no opening thereon can be formed to have a relatively thin thickness that does not cause any inconvenience, such as warpage of the substrate, on the substrate subjected to the concavo-convex processing. In the substrate with the aluminum nitride film attached thereto, obtained by the above-described forming method, the cavities 2 are present between the aluminum nitride film 1 and the substrate 10 as shown in FIG. 7. Each of the cavities 2 is located above the corresponding concave portion 10b, for example, above an interface between the flat surface 10d of the substrate 10 and the aluminum nitride film 1. The cavity 2 may be located below the above-described interface. The cross-sectional shape of the cavity 2 is, for example, a tapered shape that has an apex located above the interface and expands downward from the apex. When the second portion 1b of the aluminum nitride film is formed on the bottom surface of the concave portion 10b, the cross-sectional shape of the cavity 2 is shaped to have its bottom side protruding upward. It is noted that the hole tends to be filled with the aluminum nitride film by the heat treatment more easily when the aluminum nitride film is formed by the reactive sputtering method than when the aluminum nitride film is formed by the metal organic chemical vapor deposition method. This may be because the aluminum nitride film formed by the reactive sputtering method has weaker bonding between atoms than that by the metal organic chemical vapor deposition method.

(Semiconductor Multilayer Structure Formation Step S202)

Furthermore, as shown in FIG. 7, a semiconductor multilayer structure including a light-emitting layer 40 is formed over the aluminum nitride film 1, so that a semiconductor light-emitting element can be manufactured.

As shown in FIG. 7, the semiconductor multilayer structure includes an n-side nitride semiconductor layer 30, the light-emitting layer 40, and a p-side nitride semiconductor layer 50 in sequence from the aluminum nitride film 1 side. The semiconductor multilayer structure can be configured to emit ultraviolet light. For example, the semiconductor multilayer structure is configured to emit deep ultraviolet light with wavelengths of 220 to 350 nm. The light-emitting layer 40 has, for example, a quantum-well structure that includes $Al_xGa_{1-x}N$ well layers 42 and $Al_yGa_{1-y}N$ barrier layers 41. The well layer 42 is set, for example, such that an Al composition ratio x is within the range of 0.4×1.0 so as to have a band gap energy corresponding to a desired wavelength of the deep ultraviolet light. The barrier layer 41 is set, for example, such that an Al composition ratio y is within the range that satisfies of x<y≤1.0 so as to have a band gap energy that is higher than that of the well layer. For example, in the semiconductor light-emitting element that emits deep ultraviolet light with a peak wavelength of 280 nm, the well layer 42 includes a nitride semiconductor formed of an $Al_{0.45}Ga_{0.55}N$ in which an Al composition ratio x is 0.45, while the barrier layer 41 includes a nitride semiconductor formed of $Al_{0.56}Ga_{0.44}N$ in which an Al composition ratio y is 0.56.

The n-side nitride semiconductor layer 30 can include, for example, a first composition gradient layer 31 and a second composition gradient layer 32. The first composition gradient layer 31 is formed of, for example, undoped $Al_aGa_{1-a}N$, in which the Al composition ratio a sequentially or gradually decreases upward. The second composition gradient layer 32 is formed of, for example, $Al_bGa_{1-b}N$ doped with n-type impurities, such as Si, in which the Al composition ratio b sequentially or gradually decreases upward.

The p-side nitride semiconductor layer 50 can include, for example, a p-side clad layer 51, a p-side composition gradient clad layer 52, a p-side lightly doped layer 53, and a p-side contact layer 54. These layers can be configured to have their band gaps decreased in stages or gradually as they are located farther away from the light-emitting layer 40. The p-side clad layer 51 can include, for example, a nitride semiconductor formed of $Al_{0.63}Ga_{0.37}N$. The p-side composition gradient clad layer 52 is configured to have its band gap decreased gradually as it is located farther away from the p-side clad layer 51. The p-side composition gradient clad layer 52 can be configured to have its Al composition ratio decreased in sequence, for example, from $Al_{0.6}Ga_{0.4}N$ to GaN. The p-side lightly doped layer 53 is formed of, for example, GaN. The p-side contact layer 54 is formed of GaN that contains p-type impurities, such as Mg, at a higher concentration than the p-side lightly doped layer 53 does.

The semiconductor multilayer structure may include an electron blocking structure layer 60, which has a band gap energy larger than that of the barrier layer 41, between the p-side nitride semiconductor layer 50 and the light-emitting layer 40. The electron blocking structure layer 60 includes, for example, a first electron blocking layer 61, an intermediate layer 62, and a second electron blocking layer 63. The semiconductor multilayer structure may have a superlattice layer between the n-side nitride semiconductor layer 30 and the aluminum nitride film 1. The superlattice layer is composed of, for example, AlN layers and AlGaN layers that are alternately stacked on each other.

A partial region of the semiconductor multilayer structure may be removed so as to expose a layer on which an electrode is formed. For example, etching is performed on the semiconductor multilayer structure up to a depth of approximately 0.8 μm from the p-side nitride semiconductor layer 50 side, so that the n-side nitride semiconductor layer 30 can be exposed in the predetermined region.

(Electrode Formation Step S204)

An n-electrode 70 is formed in contact with the n-side nitride semiconductor layer 30, and a p-electrode 80 is formed in contact with the p-side nitride semiconductor layer 50. The n-electrode 70 can be formed, for example, by sputtering an alloy of titanium and aluminum. The p-electrode 80 can be formed by, for example, sputtering an indium tin oxide (ITO). A metal electrode may be further formed on the surface of the ITO.

(Singulation Step S206)

After the above-described steps, the substrate with the semiconductor multilayer structure and the electrodes is divided into individual semiconductor light-emitting elements by using a laser scribe or the like. That is, the substrate with the semiconductor multilayer structure and the electrodes is in the state of a wafer until the electrode formation step S204, and the subsequent singulation step S206 is a step of dividing the wafer into the plurality of semiconductor light-emitting elements.

According to a method of manufacturing a semiconductor light-emitting element of the embodiment configured as described above, the semiconductor multilayer structure can be formed on or over the aluminum nitride film formed on the substrate subjected to the concavo-convex processing. For example, a semiconductor multilayer structure mainly including AlGaN, which has a lattice constant that is relatively slightly different from a lattice constant of AlN, is suitable as the semiconductor multilayer structure formed on or over the aluminum nitride film of about several micrometers (μm) in thickness. The semiconductor light-emitting element having such a semiconductor multilayer structure emits, for example, ultraviolet light. A semiconductor light-emitting element that emits ultraviolet light generally tends to have a higher optical absorptance within its semiconductors as the semiconductor light-emitting element is configured to emit light with a shorter wavelength. For this reason, by using the substrate with the concave portions as in the semiconductor light-emitting element of the present embodiment, the multiple reflections within the semiconductors can be reduced, thereby improving the light output. Such a configuration is advantageous especially in the semiconductor light-emitting element that emits deep ultraviolet light with wavelengths of 220 to 350 nm, for example. As described above, the cavity 2 may be present between the aluminum nitride film 1 and the substrate 10. The cavity 2 may also be present in the semiconductor light-emitting element that has the semiconductor multilayer structure formed above the aluminum nitride film and the substrate.

Example 1

In Example 1, first, a sapphire substrate with a plurality of concave portions formed on its upper surface was prepared.

Specifically, the concave portions were formed on the upper surface, which was the C-plane, of the sapphire substrate, such that the center of each concave portion coincided with a corresponding lattice point of the equilateral triangular lattice with an interval between the adjacent lattice points being about 3 μm, and such that the diameter of the opening 10c was approximately 1 μm, and the depth of the concave portion was approximately 0.6 μm.

Then, an aluminum nitride film of approximately 1.5 μm in thickness was formed on the upper surface of the sapphire substrate with the concave portions formed therein by growing aluminum nitride thereon through the reactive sputtering method.

Figure 8A:
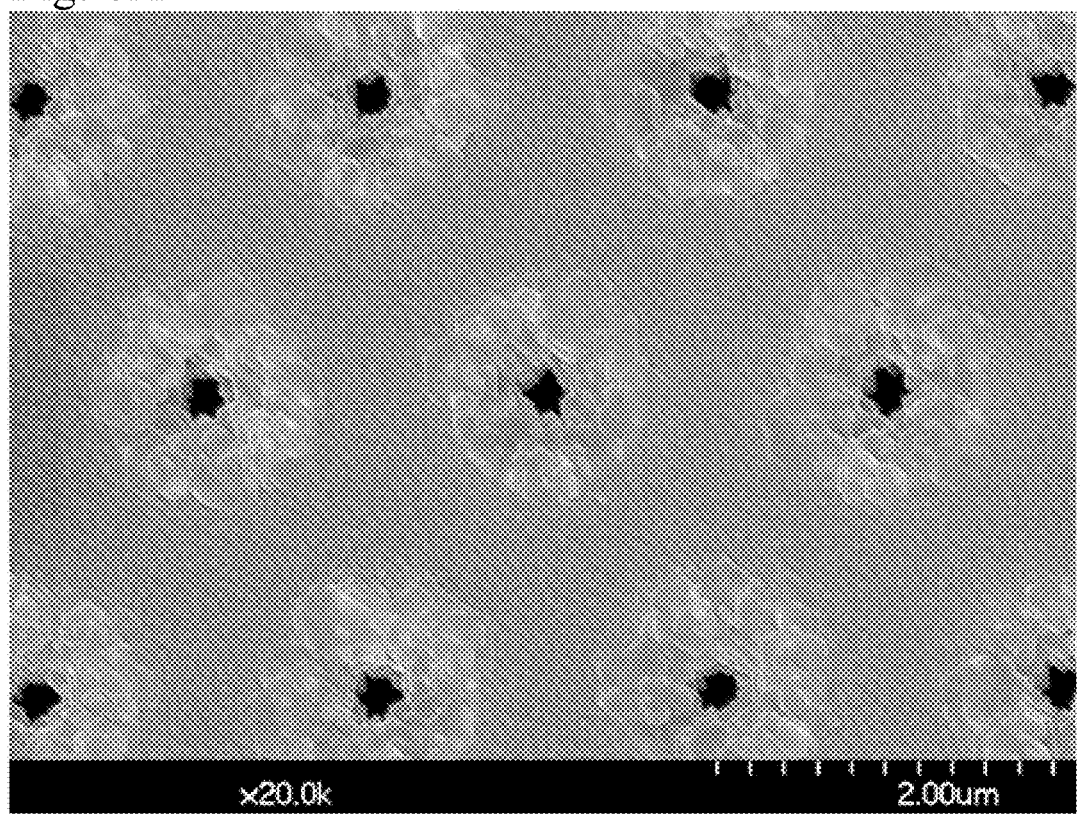
FIG. 8A is a scanning electron micrograph of an upper surface of an aluminum nitride film grown to a thickness of 1.5 μm in Example 1 according to the present invention.
Figure 8B:
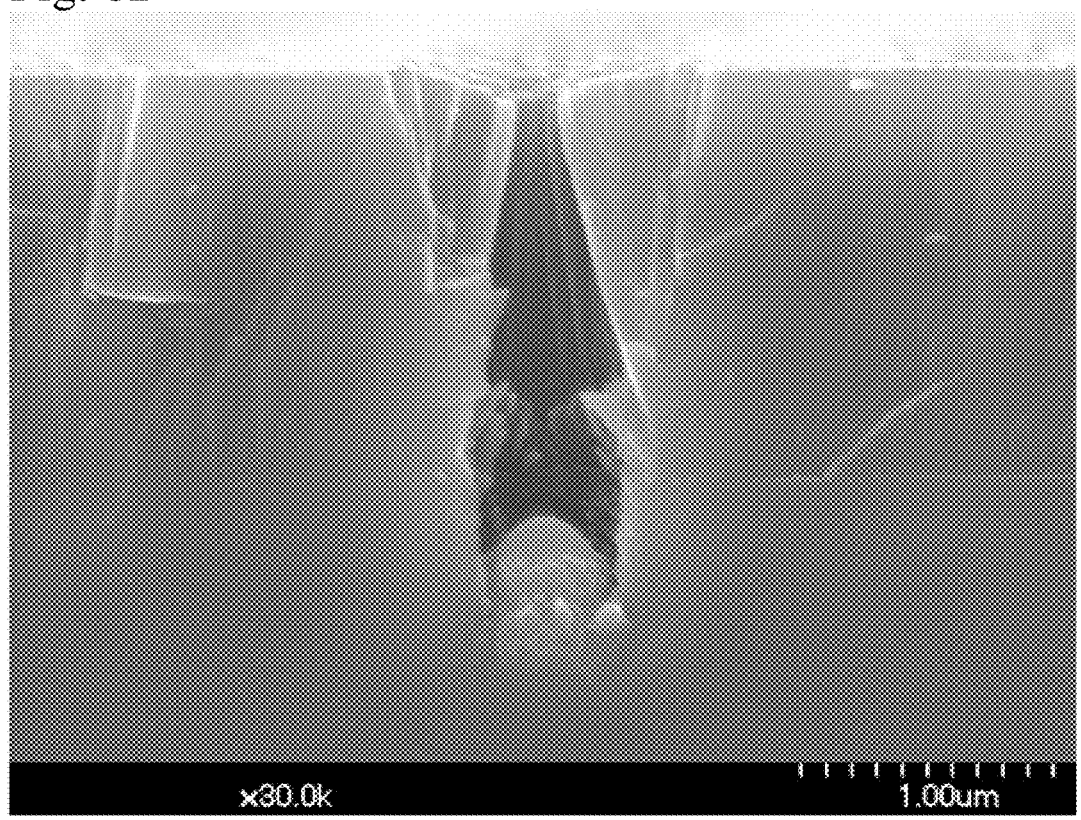
FIG. 8B is a scanning electron micrograph of the cross section of the aluminum nitride film grown to a thickness of 1.5 μm in Example 1.

In Example 1, FIG. 8A shows an SEM micrograph of the upper surface of the aluminum nitride film grown into the thickness of approximately 1.5 μm, and FIG. 8B shows a cross-sectional image of the aluminum nitride film.

As shown in FIGS. 8A and 8B, the cavities were formed in the aluminum nitride film and above the concave portions of the substrate. The diameter of the opening 2a of the cavity located at the upper surface of the aluminum nitride film was approximately 0.25 μm.

An aluminum nitride film formed under the same conditions as those of the aluminum nitride film shown in FIGS. 8A and 8B was subjected to heat treatment at a temperature of approximately 1,750° C. in a nitrogen gas, containing a carbon monoxide gas, at a flow rate that was adjusted to set the carbon monoxide gas concentration to approximately 10%.

Figure 8C:
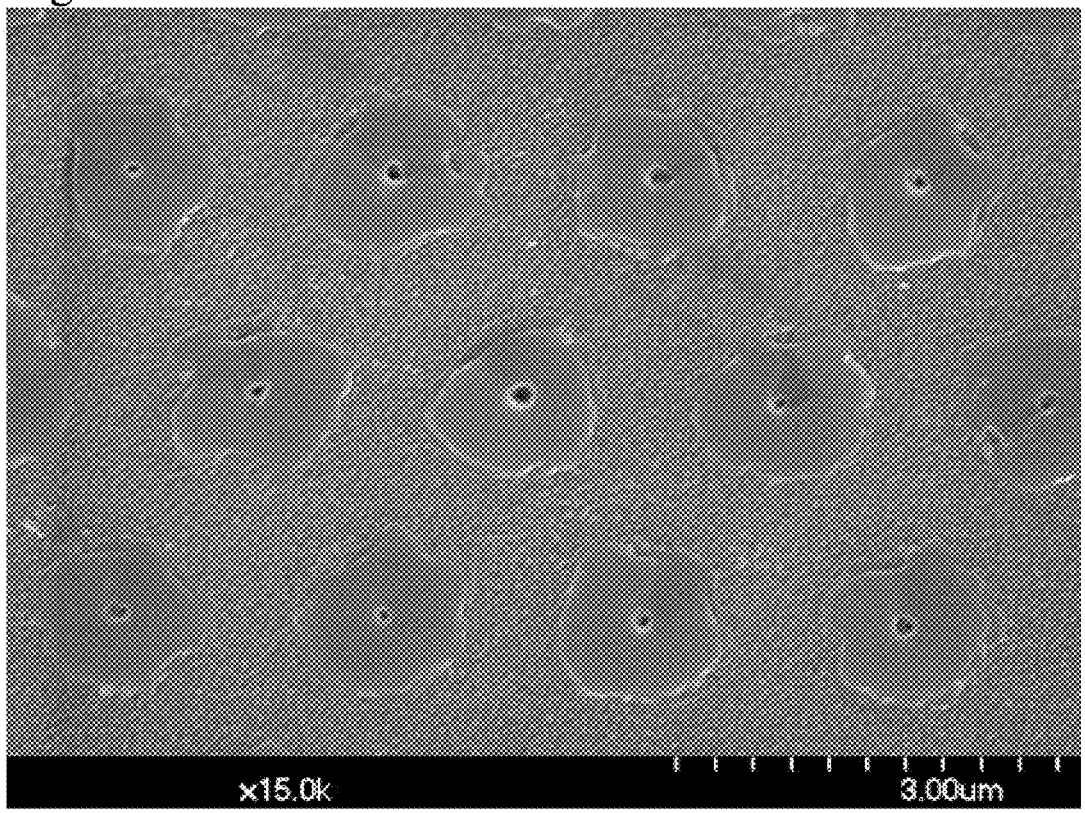
FIG. 8C is a scanning electron micrograph obtained by observing the state of a surface of the aluminum nitride film in Example 1 when applying the heat treatment thereto at a temperature of 1,750° C. for one hour in a nitrogen gas, containing a carbon monoxide gas, at a flow rate that is adjusted to set the carbon monoxide gas concentration to 10%.
Figure 8D:
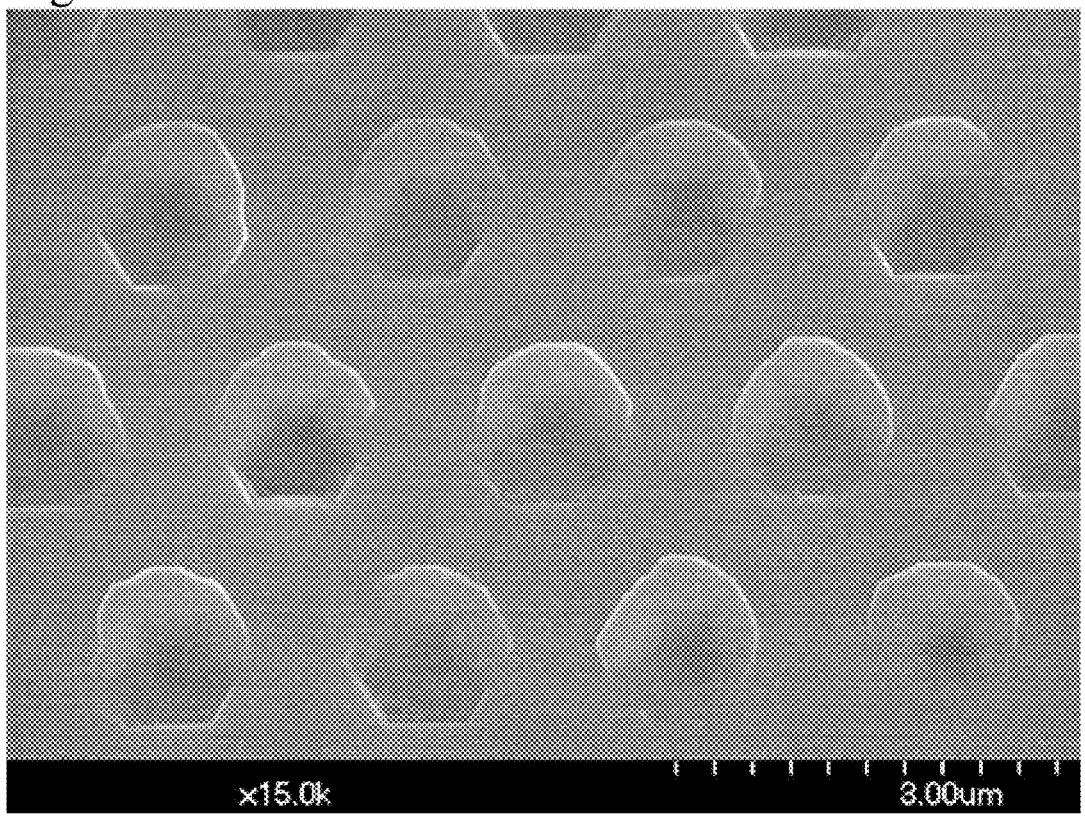
FIG. 8D is a scanning electron micrograph obtained by observing the state of a surface of the aluminum nitride film in Example 1, when applying the heat treatment thereto at a temperature of 1,750° C. for five hours in a nitrogen gas, containing a carbon monoxide gas, at a flow rate that is adjusted to set the carbon monoxide gas concentration to 10%.
Figure 8E:
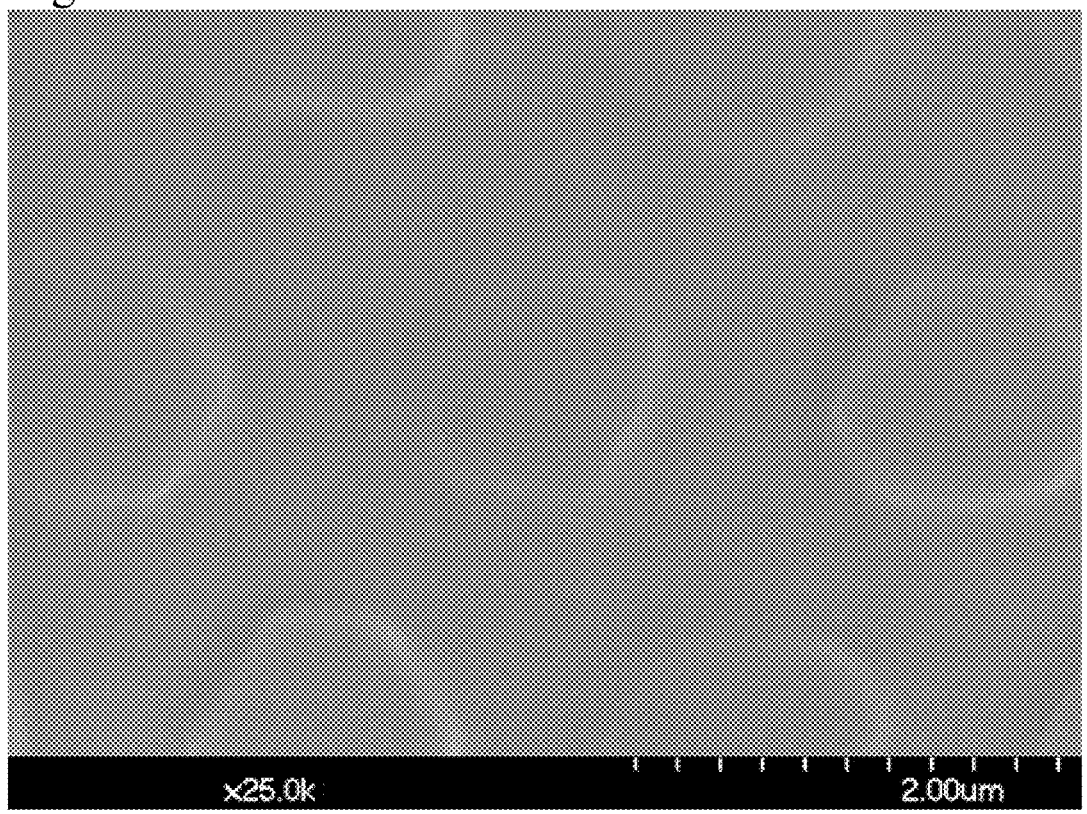
FIG. 8E is a scanning electron micrograph obtained by observing the state of a surface of the aluminum nitride film in Example 1, when applying the heat treatment thereto at a temperature of 1,750° C. for ten hours in a nitrogen gas, containing a carbon monoxide gas, at a flow rate that is adjusted to set the carbon monoxide gas concentration to 10%.
Figure 8F:
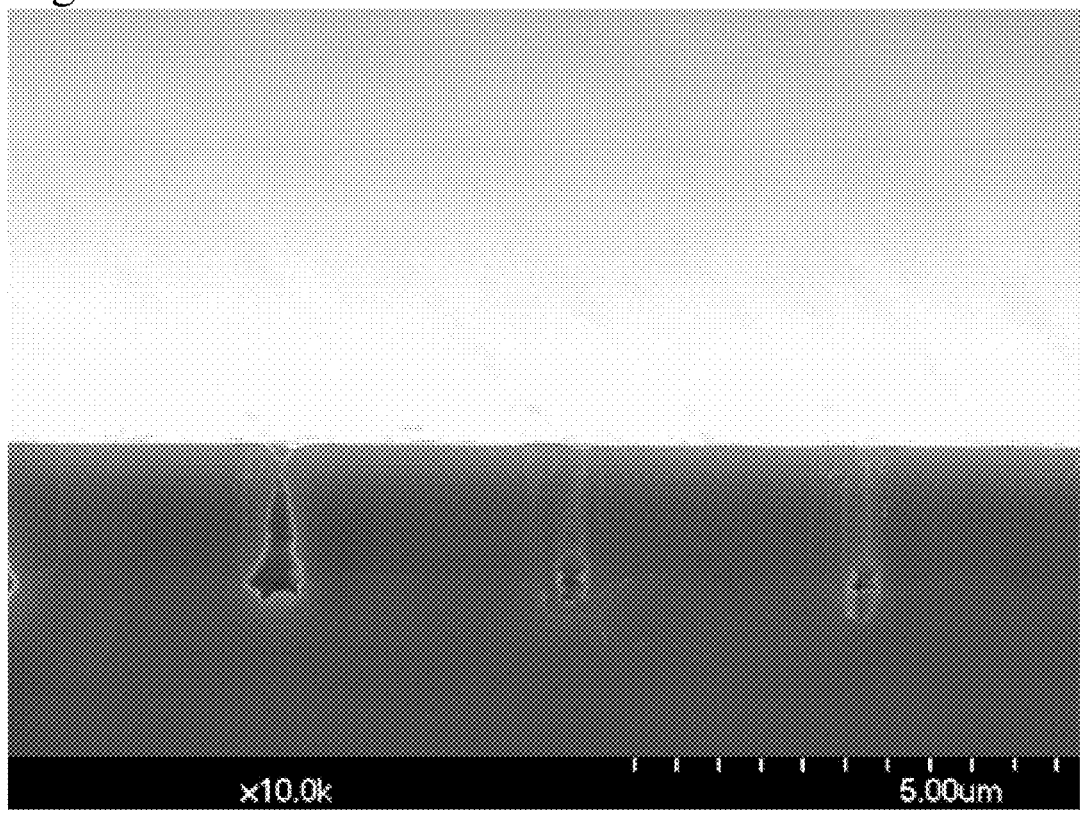
FIG. 8F is a scanning electron micrograph of the cross sections of the sapphire substrate and the aluminum nitride film, corresponding to FIG. 8C, in Example 1.
Figure 8G:
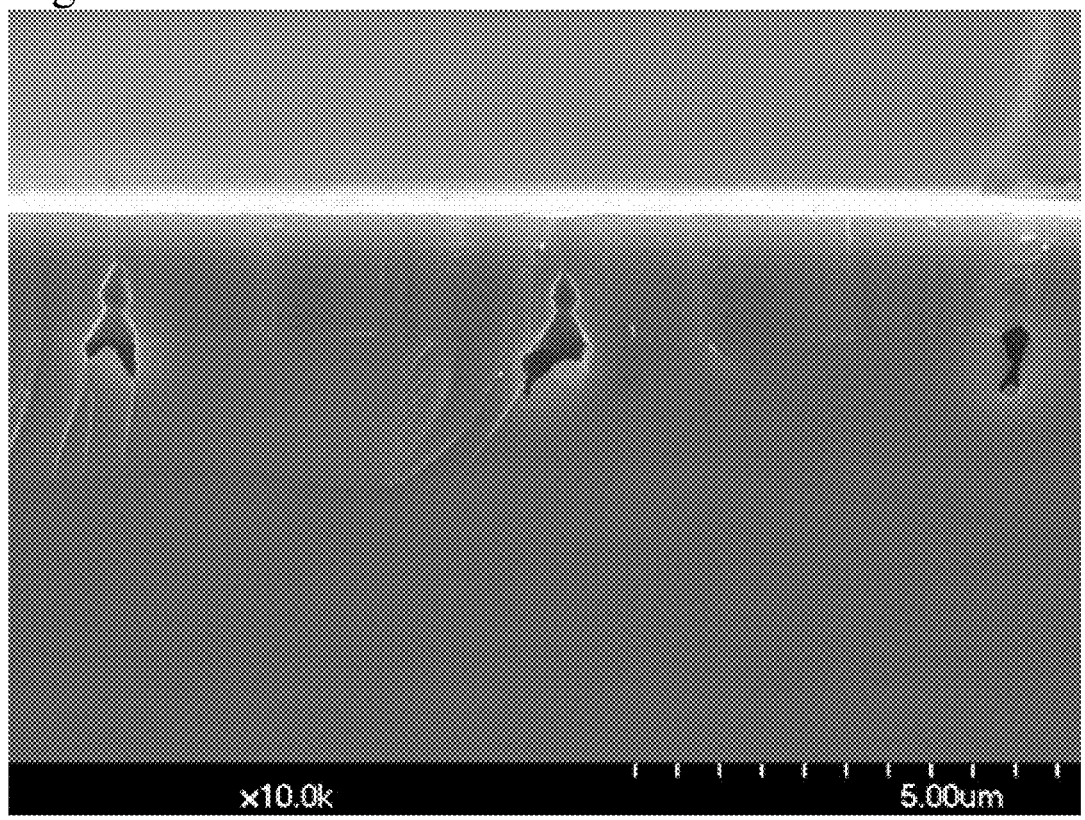
FIG. 8G is a scanning electron micrograph of the cross sections of the sapphire substrate and the aluminum nitride film, corresponding to FIG. 8D, in Example 1.
Figure 8H:
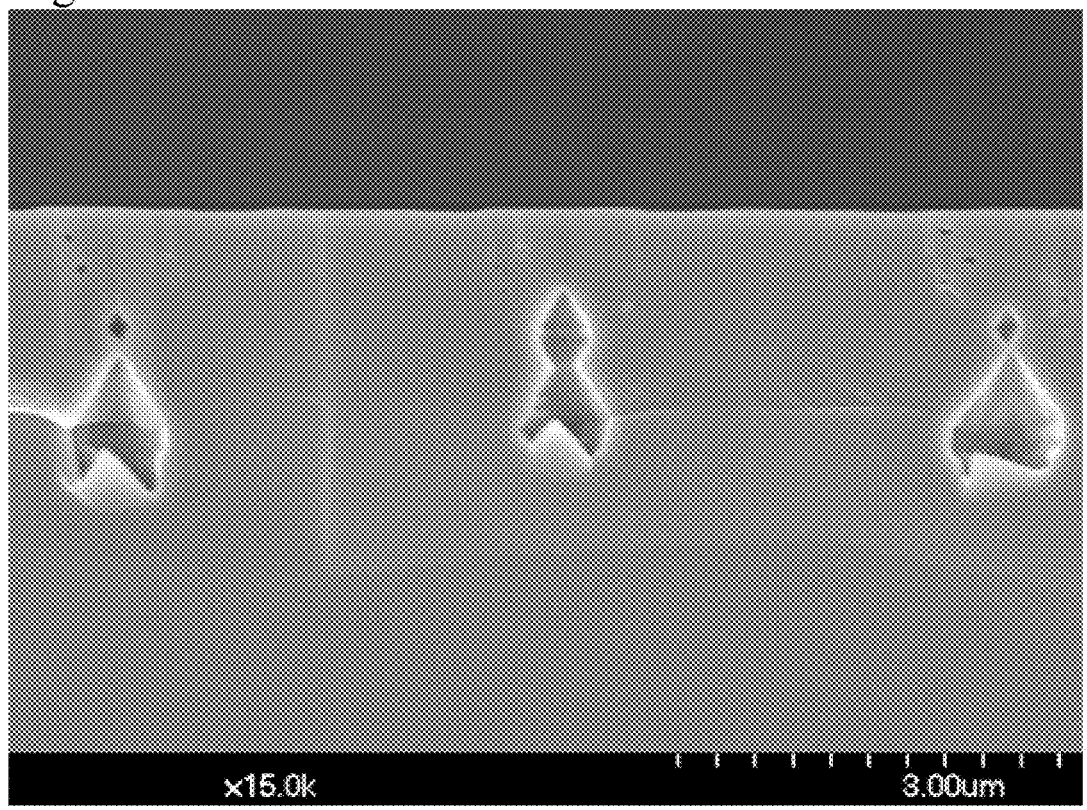
FIG. 8H is a scanning electron micrograph of the cross sections of the sapphire substrate and the aluminum nitride film, corresponding to FIG. 8E, in Example 1.

FIGS. 8C, 8D, and 8E show an SEM micrograph of the upper surface of an aluminum nitride film subjected to the heat treatment for one hour as the heat treatment time; an SEM micrograph of the upper surface of an aluminum nitride film subjected to the heat treatment for five hours as the heat treatment time; and an SEM micrograph of the upper surface of the aluminum nitride film subjected to the heat treatment for 10 hours as the heat treatment time, respectively. FIGS. 8F, 8G, and 8H show SEM micrographs of the cross sections of these respective aluminum nitride films. As shown in FIGS. 8C and 8F, after the heat treatment for one hour, some openings 2a with a diameter of approximately 0.1 μm were left on the upper surface of the aluminum nitride film. However, after the heat treatment for five hours, as shown in FIGS. 8D and 8G, the openings 2a on the upper surface of the aluminum nitride film were closed. As shown in FIGS. 8E and 8H, after the heat treatment for ten hours, the openings 2a were also closed to make the upper surface of the aluminum nitride film flat. Although the SEM micrograph in FIG. 8E showed some irregularities, it was confirmed from the result obtained by measurement through electron backscatter diffraction (EBSD) that the upper surface of the aluminum nitride film was the C-plane resulting from crystals oriented perpendicularly to the substrate, whereby the upper surface of the aluminum nitride film was planarized.

What is claimed is:

1. A method of forming an aluminum nitride film, the method comprising:
   preparing a substrate that comprises, in a surface thereof, a plurality of concave portions that are separated from each other, wherein each of the concave portions has an opening;
   forming an aluminum nitride film on said surface of the substrate and on an inner surface of each of the concave portions such that open holes are formed in a portion of the aluminum nitride film corresponding to the concave portions, wherein each of the open holes has an opening and corresponds to a respective one of the concave portions, and wherein the opening of each of the open holes is smaller than the opening of the respective one of the concave portions; and
   applying heat treatment to the substrate with the aluminum nitride film formed thereon in a nitrogen gas containing a carbon monoxide gas to close the open holes formed in the aluminum nitride film.

2. The method according to claim 1, wherein a temperature of the heat treatment is greater than or equal to 1,750° C. and less than or equal to 1,950° C.

3. The method according to claim 1, wherein, in the step of forming the aluminum nitride film on the surface, the aluminum nitride film is formed to have a thickness that is greater than or equal to a depth of one of the concave portions and less than or equal to 12 times the depth of one of the concave portions.

4. The method according to claim 1, wherein, in the step of forming the aluminum nitride film on the surface, the aluminum nitride film is formed to have a thickness that is greater than or equal to 0.5 times a maximum width of the openings of the concave portions and less than or equal to 6 times the maximum width of the openings of the concave portions.

5. The method according to claim 1, wherein, in the step of applying heat treatment, a ratio of a flow rate of the carbon monoxide gas to a total flow rate of the carbon monoxide gas and the nitrogen gas is in a range of 0.1 to 0.3.

6. The method according to claim 1, wherein the openings of the concave portions are circular and a diameter of each of the openings of the concave portion is greater than or equal to 30 nm and less than or equal to 15 μm.

7. The method according to claim 1, wherein a depth of each of the concave portions is greater than or equal to 50 nm and less than or equal to 10 μm.

8. A method of manufacturing a semiconductor light-emitting element, the method comprising:
   preparing a substrate that comprises, in a surface thereof, a plurality of concave portions that are separated from each other, wherein each of the concave portions has an opening;
   forming an aluminum nitride film on said surface of the substrate and on an inner surface of each of the concave portions such that open holes are formed in a portion of the aluminum nitride film corresponding to the concave portions, wherein each of the open holes has an opening and corresponds to a respective one of the concave portions, and wherein the opening of each of the open holes is smaller than the opening of the respective one of the concave portions;
   applying heat treatment to the substrate with the aluminum nitride film formed thereon in a nitrogen gas containing a carbon monoxide gas to close the open holes formed in the aluminum nitride film; and
   forming, over the aluminum nitride film, a semiconductor multilayer structure comprising a light-emitting layer.

9. The method according to claim 8, wherein the semiconductor multilayer structure is configured to emit ultraviolet light.

10. The method according to claim 8, wherein a temperature of the heat treatment is greater than or equal to 1,750° C. and less than or equal to 1,950° C.

11. The method according to claim 8, wherein, in the step of forming the aluminum nitride film on the surface, the aluminum nitride film is formed to have a thickness that is greater than or equal to a depth of one of the concave portions and less than or equal to 12 times the depth of one of the concave portions.

12. The method according to claim 8, wherein, in the step of forming the aluminum nitride film on the surface, the aluminum nitride film is formed to have a thickness that is greater than or equal to 0.5 times a maximum width of the openings of the concave portions and less than or equal to 6 times the maximum width of the openings of the concave portions.

13. The method according to claim 8, wherein, in the step of applying heat treatment, a ratio of a flow rate of the carbon monoxide gas to a total flow rate of the carbon monoxide gas and the nitrogen gas is in a range of 0.1 to 0.3.

14. The method according to claim 8, wherein the openings of the concave portions are circular and a diameter of each of the openings of the concave portions is greater than or equal to 30 nm and less than or equal to 15 μm.

15. The method according to claim 8, wherein a depth of each of the concave portions is greater than or equal to 50 nm and less than or equal to 10 μm.

* * * * *